Figure 1:
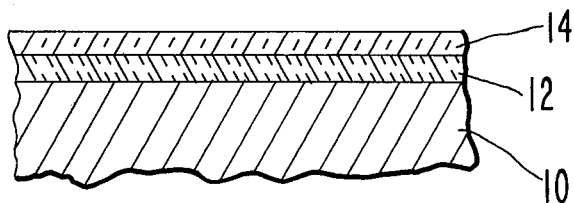

United States Patent [19]

Larrabee

[11] 3,941,630
[45] Mar. 2, 1976

[54] METHOD OF FABRICATING A CHARGED COUPLE RADIATION SENSING DEVICE

[75] Inventor: Robert Dean Larrabee, Princeton, N.J.

[73] Assignee: RCA Corporation, New York, N.Y.

[22] Filed: Apr. 29, 1974

[21] Appl. No.: 464,971

[52] U.S. Cl. .................. 156/13; 156/17; 156/18; 204/38 A; 204/192; 357/24; 357/30; 427/90; 427/94
[51] Int. Cl.² ............................. H01L 21/306
[58] Field of Search .............. 156/11, 13, 17, 18, 3; 117/212, 215, 217; 204/38 A, 192; 427/90, 94; 357/24, 30

[56] References Cited
UNITED STATES PATENTS

| | | | |
|---|---|---|---|
| 3,210,214 | 10/1965 | Smith | 156/13 |
| 3,294,653 | 12/1966 | Keller et al. | 156/13 |
| 3,436,327 | 4/1969 | Shockley | 117/212 |
| 3,615,947 | 10/1971 | Yamada | 156/11 |
| 3,668,089 | 6/1972 | Chase et al. | 156/3 |
| 3,808,476 | 4/1974 | McCann, Jr. | 357/24 |
| 3,813,291 | 5/1974 | Joshi | 156/17 |
| 3,836,446 | 9/1974 | Tiefert | 117/217 |
| 3,855,112 | 12/1974 | Tomozawa et al. | 156/3 |

Primary Examiner—Douglas J. Drummond
Assistant Examiner—Jerome W. Massie
Attorney, Agent, or Firm—H. Christoffersen; S. Cohen

[57] ABSTRACT

Method of fabricating an image sensing array, such as one of the charge coupled device (CCD) type, with a set of transparent insulated conductors over the image receiving surface. A transparent conductor layer on an insulated substrate surface is covered with a thin layer of aluminum. The desired pattern of electrodes is then defined in the aluminum by, for example, a photolithographic masking and etching process. The aluminum remaining is then anodically oxidized to form aluminum oxide, a transparent insulator. The portions of the transparent conductor not protected by the aluminum oxide are then removed and what remains are transparent conductors covered on top by transparent insulation.

9 Claims, 10 Drawing Figures

FIG. 9
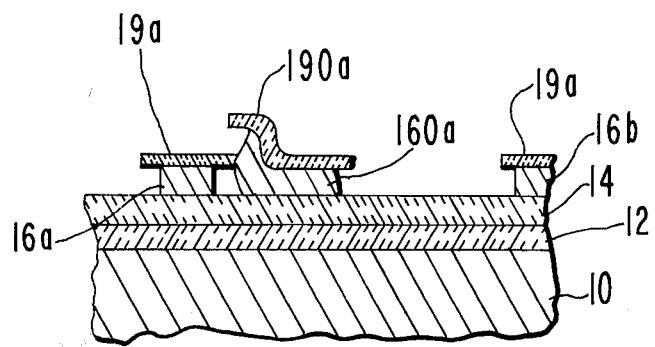
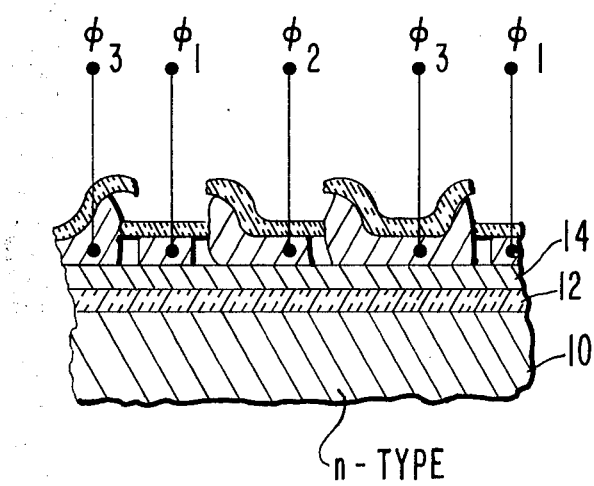
FIG. 10

METHOD OF FABRICATING A CHARGED COUPLE RADIATION SENSING DEVICE

Radiation, such as light, may be applied to a charge-coupled device, image-sensing array either to the surface of the semiconductor substrate over which the electrodes (sometimes known as "gate" electrodes) are located (hereafter termed the "upper" surface of the substrate) or to the opposite or "lower" surface of the substrate. The advantage of applying light to the upper surface is that the photon induced minority carriers are produced at or close to the locations at which they are to be utilized. A disadvantage of applying light to the lower surface is the thinning of the silicon to the point of structural weakness that is required if the photogenerated minority carriers are to reach the desired locations on the upper surface.

In the presently preferred construction of upper surface illuminated arrays, the electrodes, or at least some of the electrodes, are formed of conductors such as aluminum or polysilicon which are opaque or semi-opaque and they therefore absorb or reflect part of the incident light. This is disadvantageous and, where very low light levels are involved, such as in certain infra-red or low visible light imaging applications, is not tolerable.

The disadvantage above may be overcome by employing transparent electrodes formed of material such as tin oxide or doped indium oxide. However, the use of these materials applied in the conventional way raises the possibility of contamination of the gate oxide (the insulating layer, generally silicon dioxide, beneath the electrodes formed of this material) by the introduction of interface and/or trapping states. This is particularly true when the application of the transparent electrode material requires elevated temperatures at which the ionic mobility of impurities in the silicon dioxide insulation is large. Sputtering the transparent electrode material is another possibility but damage from high energy ion bombardment is a potential problem and heating of the structure to anneal-out this damage is undesirable from an inpurity mobility point of view.

The present method of manufacturing transparent insulated conductor arrays and more particularly transparent CCD electrodes is shown in the accompanying drawing of which:

FIGS. 1–10 are sectional views illustrating the various steps of the method. The drawing is not to scale; however, typical dimensions are given later.

FIG. 1 shows a portion of the substrate 10 which may be formed of either N or P-type silicon, a very thin silicon dioxide insulating layer 12, and a silicon nitride insulating layer 14. The substrate and the two insulating layers may be formed in any one of a number of conventional ways (see, for example, U.S. Pat. No. 3,615,947 to Yaniada). The purpose of the silicon dioxide is to properly interface the silicon nitride to the silicon substrate. The silicon nitride is employed in the present structure because this material is much more impenetrable to contaminating ions than silicon dioxide.

Figure 2:
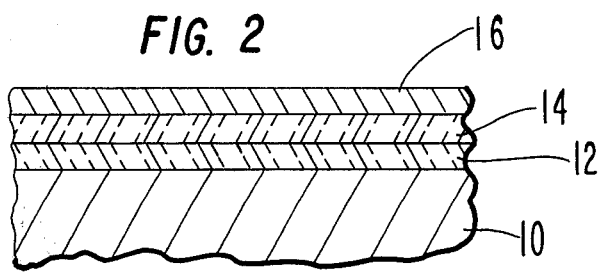

FIG. 2 illustrates the first step in the method of manufacture according to the invention. This is to deposit a uniform transparent conductive layer 16 over the entire area of the silicon nitride 14. The material employed may be tin oxide, or indium oxide, in both cases preferably doped with tin or antimony to lower their resistivity, or any one of the other transparent conductors which can be chemically etched in the manner to be discussed shortly. The deposition may be carried out in any one of a number of ways as, for example, by one of the sputtering techniques such as described in L. Maissel and R. Glang, Handbook of Thin Film Technology, McGraw Hill, 1971.

Figure 3:
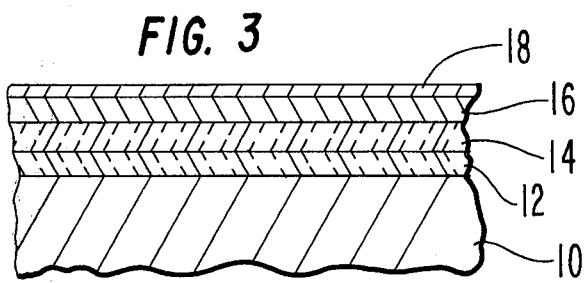

The following step, illustrated in FIG. 3, is to deposit over the transparent conductor 16 a thin but not necessarily transparent layer 18 of metallic aluminum. The deposition may be by means of conventional evaporation, as, for example, is done in metallizing integrated circuits. This deposition step is not overly critical and may employ resistance heated boats, electron beam heated crucibles or multi-stranded tungsten wire coils wetted with aluminum, as examples. The ambient vacuum may be about $10^{-5}$ Torr lower. A general reference in this area providing further details is Vacuum Deposition of Thin Films, by L. Holland; John Wiley & Sons Inc. 1956.

At the present time the preferred metal for layer 18 is aluminum as its technology is well understood and when converted to its oxide is almost totally transparent in the visible region of the spectrum. However, other metals which can be anodically converted to oxides, such as those of titanium and tantalum, which are then sufficiently transparent in a region of the spectrum of interest, are also possibilities.

Next the desired electrode (conductor) pattern is defined on the aluminum by a photolithographic masking and etching process. This involves applying a photoresist to the surface, exposing the photoresist to light through a mask of the pattern desired and then developing the photoresist.

The portions of the aluminum layer not protected by the photoresist pattern are now removed with an etching fluid of the kind that does not attack the underlying transparent conductor. For example, using a transparent conductor layer 16 formed of tin oxide, an alkaline based aluminum etch such as Metex Aurostrip, MacDermid Inc., Waterbury, Conn. for defining the aluminum layer may be employed.

Figure 4:
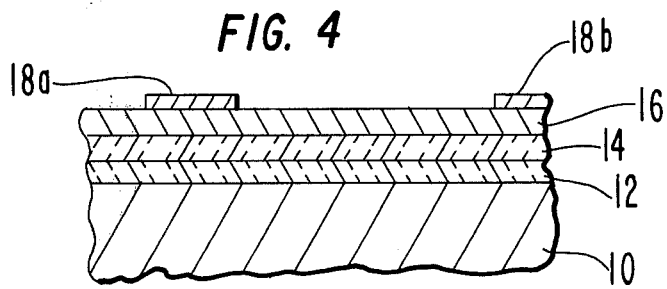

The structure as it appears after the etching step is shown in FIG. 4. A plurality of aluminum conductors, two of which are shown at 18a and 18b, lie on the surface of the transparent conductor 16.

Figure 5:
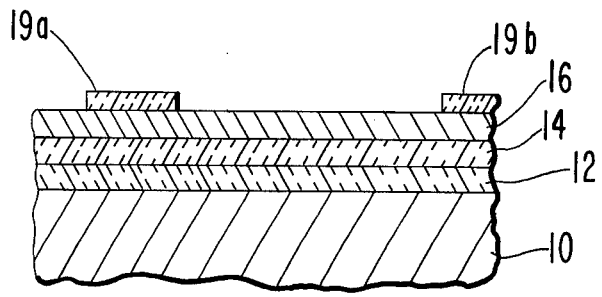

The conductors 18 are now converted to insulation by anodic oxidation. The involves placing the entire structure in a suitable bath and passing current through the aluminum via the transparent conductor layers, causing oxygen to combine with the aluminum to form aluminum oxide. The anodic oxidation is continued for a sufficient interval of time to cause the complete conversion of the aluminum to aluminum oxide. The use of the underlying conductive layer 16 during the anodic oxidation process assures that there will always be a conductive path to all parts of the aluminum pattern and no possibility of isolated "islands" of unoxidized aluminum remaining. Aluminum oxide, as is well understood, is transparent. The structure, as it appears after the oxidation is completed, is shown in FIG. 5. The aluminum strips 18a and 18b have been converted to transparent aluminum oxide strips 19a, 19b.

The oxidation bath for the aluminum may be a 3% by weight solution of either ammonium citrate or tartrate in water. The work to be oxidized is immersed in this bath and (the aluminum) is biased positive with respect to another aluminum electrode in the bath. A constant current of about 1 ma/in² of work surface is passed through this cell and the voltage monitored as a means of estimating the aluminum oxide thickness (about 5A° per volt). When the desired voltage (thickness) is reached, the oxidation is complete.

The aluminum oxide is now used as a mask in a second etching process. Etching material is chosen which does not attack the aluminum oxide and which does dissolve the transparent conductor. A suitable etchant, for example, consists of a mixture of 200ml. of HCl and 700ml. of methyl alcohol into which zinc powder is sprinkled just prior to use. The etching is allowed to proceed to a point at which the only transparent conductor remaining is located beneath the aluminum oxide insulation and is somewhat undercut relative to the edges of that aluminum oxide. In other words, in the structure remaining, as shown in FIG. 6, each aluminum oxide area such as 19a overlaps, at both of its edges, the underlying transparent conductor, such as 16a, lying beneath the aluminum oxide.

Figure 6:
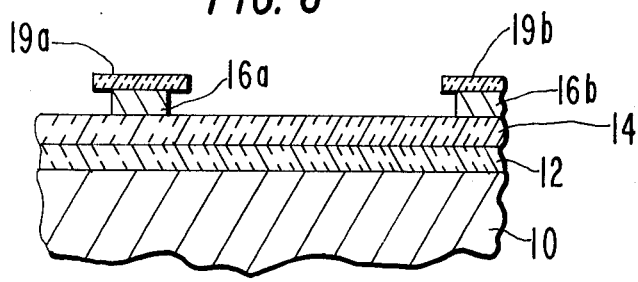

As may be observed from FIG. 6, there are now a plurality of transparent conductor areas, two of which, 16a and 16b, are shown, each covered on top by a transparent insulator, as shown at 19a and 19b. These conductors can be patterned to form the gate electrodes for one phase of a multiple phase CCD. In the present example, the CCD is a three-phase structure (as discussed shortly in connection with FIG. 10); however, the same technique as described may be employed for two-phase, four-phase or higher phase CCD image sensing arrays.

Figure 7:
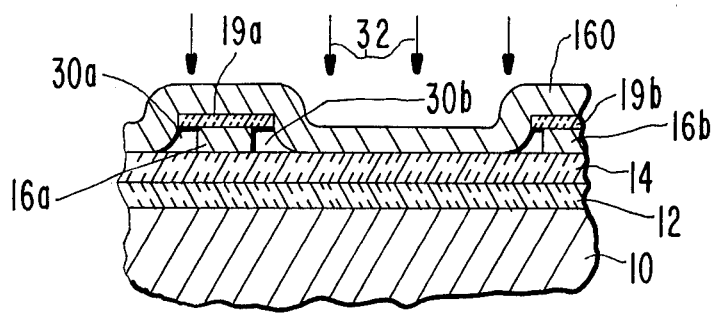
Figure 8:
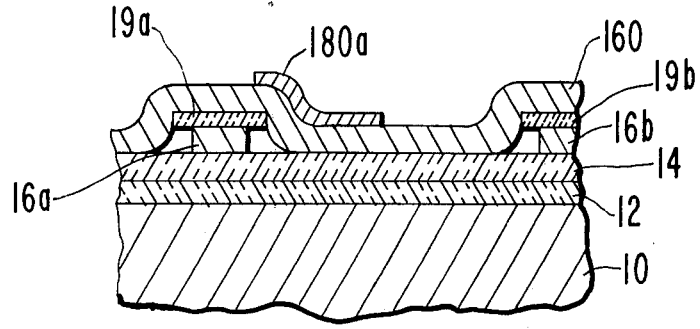

After the phase 1 electrodes are completed, as described, the same steps are repeated in the manner shown in the following figures to form the phase 2 electrodes. FIG. 7 shows the second transparent conductor layer 160. It is important that this layer be deposited onto the exposed silicon nitride layer 14 and the exposed surface of the aluminum oxide areas from the top, as shown by the direction of the arrows 32 in FIG. 7. The purpose of applying this transparent conductor layer in this way is to insure that there will be spaces such as 30a, 30b and so on, between the first insulated conductors such as 16a and 16b and the second conductor layer 160 for insulating these two conductive regions from each other.

After the step above, the second layer of aluminum is deposited on top of this structure and then patterns are defined in the aluminum by the same photolithographic technique already discussed in which the unwanted aluminum is removed. The structure remaining is that shown in FIG. 8 where one of the remaining aluminum areas 180a is visible.

Next the aluminum areas are anodically oxidized to convert the aluminum to transparent aluminum oxide and then the portion of the transparent layer 160 not protected by the aluminum oxide is etched away in the manner already discussed. The structure remaining is that shown in FIG. 9 where one of the phase-two ($\phi_2$) electrodes, 160a covered on top by aluminum oxide insulation 190a, is shown.

FIG. 10 illustrates the final structure, that is, the structure obtained after the third repetition of the process just described. So that the reader may more easily see how the circuit operates, the multiple phase voltage leads are also shown connected to the various conductors (the various gate electrodes).

Typical thickness values for the various layers shown may be:

| | |
|---|---|
| substrate 10 | – 10 mils |
| silicon dioxide 12 | – 750 A° |
| silicon nitride 14 | – 750 A° |
| transparent conductor such as 16 | – 2000 A° |
| evaporated aluminum | – 1000 A° |

The operation of a CCD image sensing array such as shown in part in FIG. 10 is now well understood in the art. In brief, during a first interval of time, known as an "integration time", appropriate voltage levels may be applied to certain of the electrodes. For example, if the substrate 10 is n-type silicon (the minority carriers in this case are holes), the phase 1 and phase 2 electrodes may be maintained at a negative voltage level, such as −10 volts, during the integration time. During this period, a light image is projected through the transparent insulated electrodes and through the transparent silicon nitride and silicon dioxide layers to the surface of the silicon substrate. The light (photons) causes the generation of electron-hole pairs in the silicon substrate, and the holes accumulate as surface charge beneath phase 1 and phase 2 electrodes. After the integration time, the charges thus accumulated may be propagated out of the array by the application of the three phase voltages to the triplets of electrodes indicated in FIG. 10.

What is claimed is:

1. A method of fabricating a charge coupled radiation sensing array comprising the steps of:
    forming an insulating layer on a semiconductor substrate;
    covering a surface of this layer with a transparent conductor;
    forming a pattern of gate electrodes on this transparent conductor layer of a metal which, when oxidized, is transparent in a region of the radiation spectrum of interest;
    oxidizing substantially in its entirety the pattern of gate electrodes to convert the same to a transparent insulating pattern; and
    etching away that portion of the transparent conductor layer not covered by said insulating pattern to thereby form a pattern of transparent conductors covered by transparent insulation.

2. A method as set forth in claim 1 wherein said step of forming an insulating layer on the substrate comprises forming a silicon dioxide layer then covering that silicon dioxide layer with silicon nitride.

3. A method as set forth in claim 2, wherein said step of covering a surface of the insulating layer with a transparent conductor comprises sputtering said conductor onto said surface.

4. A method as set forth in claim 1 wherein the step of forming a pattern of gate electrodes comprises depositing aluminum onto said transparent conductor, defining a masking pattern on said aluminum, and then removing the portions of the aluminum not covered by the pattern.

5. A method as set forth in claim 4 wherein the deposition of aluminum is carried out in a vacuum.

6. A method as set forth in claim 4, wherein the step of oxidizing the pattern comprises anodically oxidizing said pattern.

7. A method as set forth in claim 1, wherein the etching step comprising chemically etching.

8. A method as set forth in claim 1, wherein the transparent conductor is tin oxide.

9. A method as set forth in claim 1, wherein said etching step comprises chemically etching and wherein the etching is carried out for a time interval sufficient to cause the pattern of transparent conductors to be undercut beyond the edges of the insulation.

* * * * *